US010347733B2

(12) United States Patent
He et al.

(10) Patent No.: US 10,347,733 B2
(45) Date of Patent: Jul. 9, 2019

(54) RADIOFREQUENCY SWITCH DEVICE AND MANUFACTURING METHOD THEREOF

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 2 days.

(21) Appl. No.: 15/802,419

(22) Filed: Nov. 2, 2017

(65) Prior Publication Data

US 2019/0109200 A1 Apr. 11, 2019

(30) Foreign Application Priority Data

Oct. 9, 2017 (CN) .......................... 2017 1 0929657

(51) Int. Cl.
 *H01L 29/49* (2006.01)
 *H01L 29/06* (2006.01)
 *H01L 23/66* (2006.01)

(52) U.S. Cl.
 CPC .......... *H01L 29/4933* (2013.01); *H01L 23/66* (2013.01); *H01L 29/0607* (2013.01)

(58) Field of Classification Search
 CPC . H01L 29/49; H01L 29/4933; H01L 29/0607; H01L 23/66
 See application file for complete search history.

(56) References Cited

U.S. PATENT DOCUMENTS

| 8,105,887 B2 | 1/2012 | Luo |
| 8,198,673 B2 | 6/2012 | Yin |
| 9,209,305 B1 | 12/2015 | Zhang |
| 2008/0203501 A1* | 8/2008 | Yamazaki ............... H01L 27/12 257/413 |
| 2009/0001521 A1* | 1/2009 | Yonekawa ............ H01L 23/544 257/620 |
| 2017/0345750 A1* | 11/2017 | Tsuboi .............. H01L 21/76283 |

* cited by examiner

*Primary Examiner* — Phuc T Dang
(74) *Attorney, Agent, or Firm* — Winston Hsu

(57) ABSTRACT

A radiofrequency switch device includes an insulation layer, a semiconductor layer, a gate structure, a first doped region, a second doped region, an epitaxial layer, a first silicide layer, and a second silicide layer. The semiconductor layer is disposed on the insulation layer. The gate structure is disposed on the semiconductor layer. The first doped region and the second doped region are disposed in the semiconductor layer at two opposite sides of the gate structure respectively. The epitaxial layer is disposed on the first doped region. The first silicide layer is disposed on the epitaxial layer. The second silicide layer is disposed in the second doped region.

17 Claims, 7 Drawing Sheets

RADIOFREQUENCY SWITCH DEVICE AND MANUFACTURING METHOD THEREOF

BACKGROUND OF THE INVENTION

1. Field of the Invention

The present invention relates to a radiofrequency switch device and a manufacturing method thereof, and more particularly, to a radiofrequency switch device including a silicide layer and a manufacturing method thereof.

2. Description of the Prior Art

In the semiconductor manufacturing related field, the size of functional devices in the integrated circuits becomes smaller continuously for enhancing the performance of the chip. However, as the density of the functional devices increased, the influence of many electrical properties on the device operation performance becomes more obvious, and that will hinder the development of scaling down. For example, in the radiofrequency (RF) switch device, the on resistance ($R_{on}$) and the off capacitance ($C_{off}$) are important indexes. The consumption ratio of signals passing through the switch device at the on-stage is rated to the on resistance, and the leakage ratio of signals at the off-stage is related to the off capacitance. The off capacitance of the RF switch device may be influenced by the structural design and material properties of the RF switch device. The fringing capacitance and the parasitic capacitance will become higher when components in the RF switch device are scaled down, and the off capacitance cannot be reduced effectively for the specification requirement of the RF switch device operation.

SUMMARY OF THE INVENTION

A radiofrequency (RF) switch device and a manufacturing method thereof are provided in the present invention. A first silicide layer is formed on an epitaxial layer and a second silicide layer is formed in a doped region for increasing the distance between the first silicide layer and the second silicide layer. The capacitance effect between the first silicide layer and the second silicide layer may be reduced accordingly, and the purpose of reducing the off capacitance of the RF switch device may be achieved.

According to an embodiment of the present invention, a radiofrequency (RF) switch device is provided. The RF switch device includes an insulation layer, a semiconductor layer, a gate structure, a first doped region, a second doped region, an epitaxial layer, a first silicide layer, and a second silicide layer. The semiconductor layer is disposed on the insulation layer. The gate structure is disposed on the semiconductor layer. The first doped region and the second doped region are disposed in the semiconductor layer. The first doped region and the second doped region are disposed at two opposite sides of the gate structure respectively. The epitaxial layer is disposed on the first doped region. The first silicide layer is disposed on the epitaxial layer. The second silicide layer is disposed in the second doped region.

According to an embodiment of the present invention, a manufacturing method of a radiofrequency (RF) switch device is provided. The manufacturing method includes the following steps. Firstly, a semiconductor layer formed on an insulation layer is provided. A gate structure is formed on the semiconductor layer. A first doped region and a second doped region are formed in the semiconductor layer. The first doped region and the second doped region are formed at two opposite sides of the gate structure respectively. An epitaxial layer is formed on the first doped region. A first silicide layer is formed on the epitaxial layer. A second silicide layer is formed in the second doped region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-7 are schematic drawings illustrating a manufacturing method of the radiofrequency switch device according to the first embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
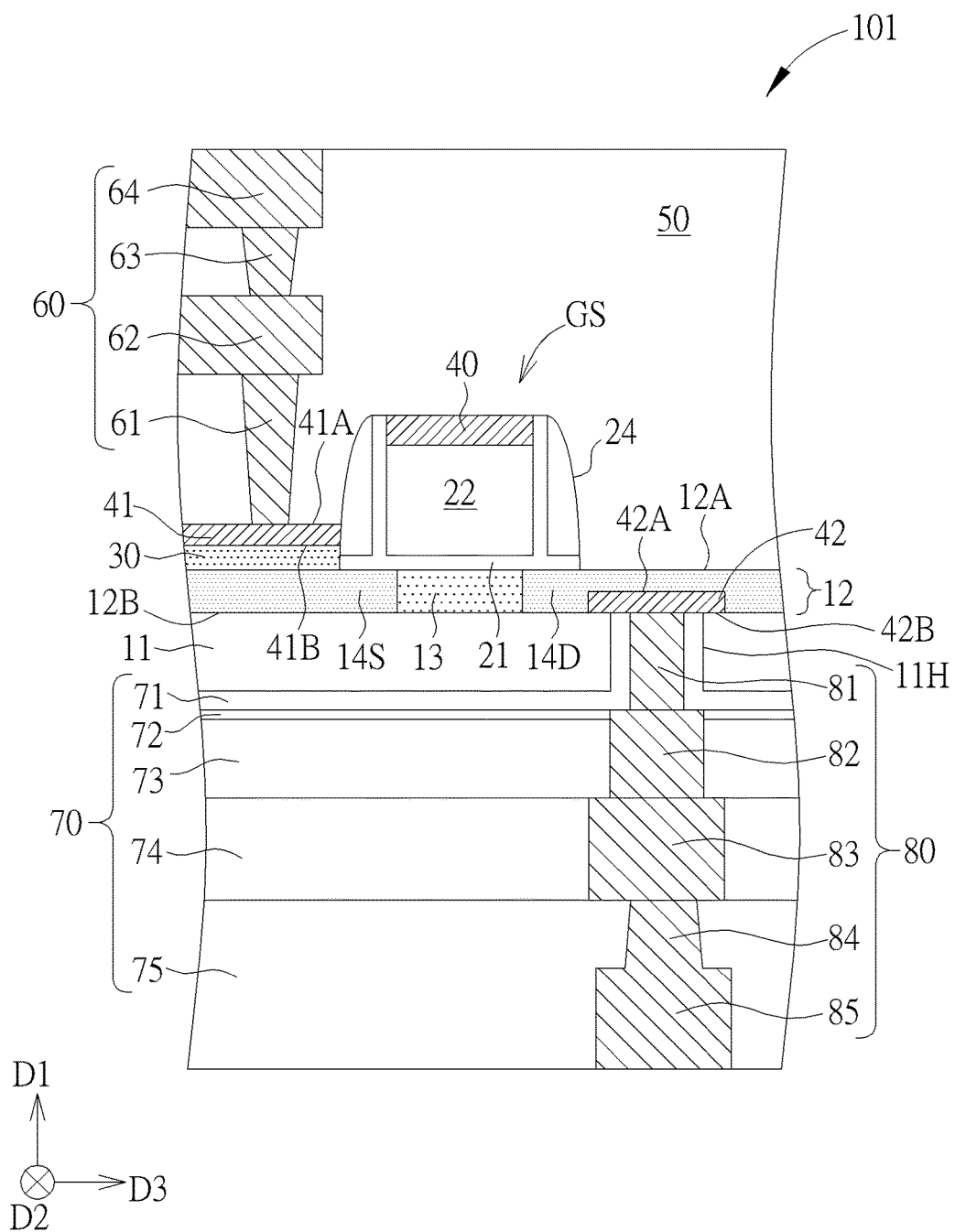
FIG. 1 is a schematic drawing illustrating a radiofrequency switch device according to a first embodiment of the present invention.
Figure 2:
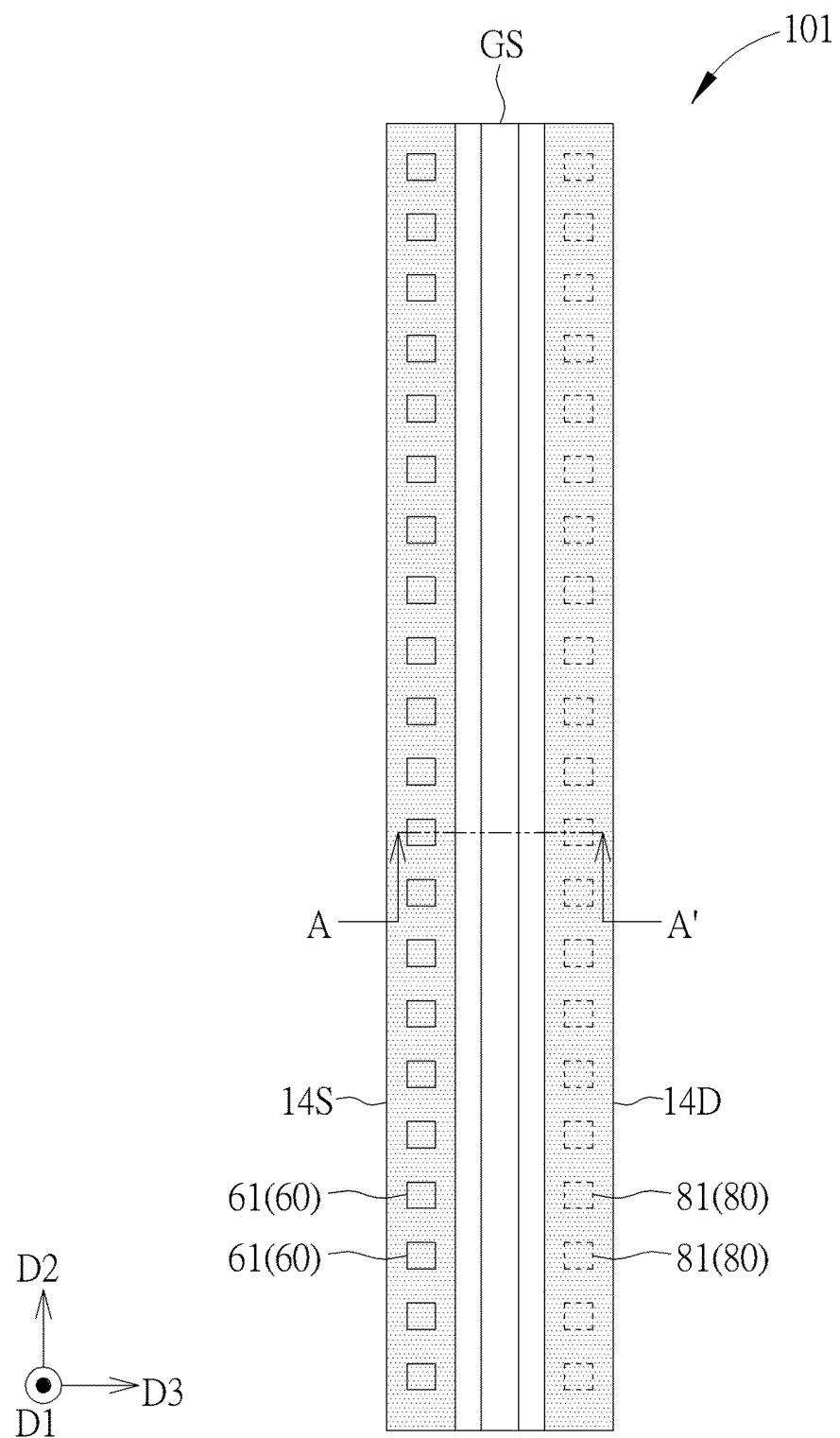
FIG. 2 is a top view schematic drawing illustrating the radiofrequency switch device according to the first embodiment of the present invention.

Please refer to FIG. 1 and FIG. 2. FIG. 1 is a schematic drawing illustrating a radiofrequency (RF) switch device according to a first embodiment of the present invention. FIG. 2 is a top view schematic drawing illustrating the RF switch device in this embodiment. FIG. 1 may be regarded as a cross-sectional diagram taken along a line A-A' in FIG. 2, but not limited thereto. As shown in FIG. 1 and FIG. 2, a RF switch device 101 is provided in this embodiment. The RF switch device 101 includes an insulation layer 11, a semiconductor layer 12, a gate structure GS, a first doped region 14S, a second doped region 14D, an epitaxial layer 30, a first silicide layer 41, and a second silicide layer 42. In some embodiments, the insulation layer 11 may include an oxide insulation layer, such as a buried oxide (BOX) in a silicon on insulator (SOI) substrate, or other appropriate insulation material layers. The semiconductor layer 12 is disposed on the insulation layer 11. In some embodiments, the semiconductor layer 12 may include a semiconductor layer containing silicon, such as a single crystalline silicon layer disposed on a buried oxide of a SOI substrate, or other semiconductor materials. The gate structure GS is disposed on the semiconductor layer 12. In some embodiments, the gate structure GS may include a gate dielectric layer 21 and a gate electrode 22 stacked in a thickness direction (such as a first direction D1 shown in FIG. 1) of the insulation layer 11, but not limited thereto. In some embodiments, the gate dielectric layer 21 may include an oxide layer, such as a silicon oxide layer, and the gate electrode 22 may include a non-metal gate electrode, such as a polysilicon gate electrode, or gate electrodes formed by other suitable conductive materials, but not limited thereto. Additionally, in some embodiments, the RF switch device 101 may further include a spacer structure 24 disposed on the sidewall of the gate structure GS, and the spacer structure 24 may include a single layer structure or a multiple layer structure composed of different insulation materials, such as silicon nitride and silicon oxide, but not limited thereto.

The first doped region 14S and the second doped region 14D are disposed in the semiconductor layer 12, and the first doped region 14S and the second doped region 14D are disposed at two opposite sides of the gate structure GS respectively. For example, in some embodiments, the gate structure GS may extend in a second direction D2. The first doped region 14S and the second doped region 14D may be disposed at two opposite sides of the gate structure GS in a third direction D3 orthogonal to the second direction D2 respectively, and the first doped region 14S and the second doped region 14D may also extend in the second direction D2, but not limited thereto. In addition, the semiconductor layer 12 may include a channel region 13 located between the first doped region 14S and the second doped region 14D in the third direction D3, and the channel region 13 may be located under the gate structure GS in the first direction D1. In some embodiments, the first doped region 14S and the second doped region 14D may be doped region doped with N type dopants, such as phosphorus (P) and arsenic (As), but not limited thereto. In some embodiments, other kinds of N type dopants or other conductivity type dopants may also be used to form the first doped region 14S and the second doped region 14D. The epitaxial layer 30 is disposed on the first doped region 14S. In some embodiments, the epitaxial layer 30 may include silicon germanium (SiGe) epitaxial layer or other suitable epitaxial materials. The first silicide layer 41 is disposed on the epitaxial layer 30, and the second silicide layer 42 is disposed in the second doped region 14S. In some embodiments, the first silicide layer 41 and the second silicide layer 42 may include an identical conductive silicide material, such as a metal silicide material, or different conductive silicide materials, but not limited thereto. The metal silicide material mentioned above may include cobalt-silicide, nickel-silicide, or other suitable metal silicide. The first silicide layer 41 and the second silicide layer 42 are disposed on different planes for increasing the distance between the first silicide layer 41 and the second silicide layer 42. The capacitance effects (such as the fringing capacitance and/or the parasitic capacitance) between the first silicide layer 41 and the second silicide layer 42 may be reduced accordingly, and the purpose of reducing the off capacitance ($C_{off}$) of the RF switch device 101 may be achieved.

Specifically, in some embodiments, the first doped region 14S and the second doped region 14D may be a source doped region and a drain doped region of the RF switch device 101 respectively, and the first silicide layer 41 and the second silicide layer 42 may be regarded as a source silicide layer and a drain silicide layer respectively, but not limited thereto. In some embodiments, the first doped region 14S may be a drain doped region, and the second doped region 14D may be a source doped region. Additionally, the epitaxial layer 30 may be disposed between the first silicide layer 41 and the first doped region 14S in the thickness direction (such as the first direction D1) of the insulation layer 11 because the first silicide layer 41 is disposed on the epitaxial layer 30 and the second silicide layer 42 is disposed in the second doped region 14D. In some embodiments, a bottom surface (such as a second bottom surface 41B shown in FIG. 1) of the first silicide layer 41 may be higher than a top surface (such as a first top surface 12A shown in FIG. 1) of the semiconductor layer 12 in the first direction D1, a top surface (such as a second top surface 41A shown in FIG. 1) of the first silicide layer 41 may be higher than a top surface (such as a third top surface 42A shown in FIG. 1) of the second silicide layer 42 in the first direction D1, and the second bottom surface 41B of the first silicide layer 41 may be higher than the third top surface 42A of the second silicide layer 42 in the first direction D1. The first top surface 12A, the second top surface 41A, and the third top surface 42A mentioned above may be the topmost surface of the semiconductor layer 12, the topmost surface of the first silicide layer 41, and the topmost surface of the second silicide layer 42 in the first direction D1 respectively, but not limited thereto.

As shown in FIG. 1 and FIG. 2, the RF switch device 101 may further include a gate silicide layer 40, a first interlayer dielectric 50, a first connection structure 60, a second interlayer dielectric 70, and a second connection structure 80. The gate silicide layer 40 may be disposed on the gate electrode 22, and the gate silicide layer 40 may include metal silicide, such as cobalt-silicide, nickel-silicide, or other suitable metal silicide. The first interlayer dielectric 50 is disposed on the gate structure GS, the semiconductor layer 12, and the first silicide layer 41. The second interlayer dielectric 70 is disposed under the semiconductor layer 12. In other words, the first interlayer dielectric 50 and the second interlayer dielectric 70 may be respectively disposed at the top side and the bottom side of the semiconductor layer 12 in the thickness direction (such as the first direction D1) of the insulation layer 11, and the semiconductor layer 12 may be disposed between the first interlayer dielectric 50 and the second interlayer dielectric 70 in the first direction D1. The first connection structure 60 is disposed in the first interlayer dielectric 50 and disposed on the first silicide layer 41, and the first connection structure 60 is electrically connected with the first silicide layer 41. The second connection structure 80 is disposed in the second interlayer dielectric 70, and the second connection structure 80 is electrically connected with the second silicide layer 42. In other words, the first connection structure 60 may be regarded as a connection structure extending upwards from the first silicide layer 41 in the first direction D1, and the second connection structure 80 may be regarded as a connection structure extending downwards from the second silicide layer 42. The distance between the first connection structure 60 and the second connection structure 80 may be increased by the allocation described above. The capacitance effects (such as the fringing capacitance and/or the parasitic capacitance) between the first connection structure 60 and the second connection structure 80 may be reduced accordingly, and the off capacitance ($C_{off}$) of the RF switch device 101 may be further reduced.

In some embodiments, the first interlayer dielectric 50 may include multiple layers of dielectric material, such as silicon oxide, silicon oxynitride, low dielectric constant (low-k) materials, or other suitable dielectric materials, and the first connection structure 60 may include a plurality of plugs (such as a first plug 61 and a second plug 63 shown in FIG. 1) and a plurality of conductive layers (such as a first conductive layer 62 and a second conductive layer 64 shown in FIG. 1) alternately stacked. In addition, the second interlayer dielectric 70 may also include multiple layers of dielectric material (such as a first dielectric layer 71, a hard mask layer 72, a second dielectric layer 73, a third dielectric layer 74, and a fourth dielectric layer 75 shown in FIG. 1), and the second connection structure 80 may include a plurality of conductive structures stacked with one another.

For example, the second connection structure 80 may include a contact structure 81 disposed in the first dielectric layer 71, an interconnection structure 82 penetrating the second dielectric layer 73 and the hard mask layer 72, a first backside conductive layer 83 disposed in the third dielectric layer 74, a backside plug 84 disposed in the fourth dielectric layer 75, and a second backside conductive layer 85 disposed in the fourth dielectric layer 75. The first dielectric layer 71, the hard mask layer 72, the second dielectric layer 73, the third dielectric layer 74, and the fourth dielectric layer 75 mentioned above may include silicon oxide, silicon oxynitride, low-k material, or other suitable dielectric materials, and the first plug 61, the first conductive layer 62, the second plug 63, the second conductive layer 64, the contact structure 81, the interconnection structure 82, the first backside conductive layer 83, the backside plug 84, and the second backside conductive layer 85 may respectively include a low electrical resistivity material and a barrier layer, but not limited thereto. The low electrical resistivity material mentioned above may include materials with relatively lower resistivity, such as copper, aluminum, and tungsten, and the barrier layer mentioned above may include titanium nitride, tantalum nitride, or other suitable barrier materials, but not limited thereto.

In some embodiments, the insulation layer 11 may include an opening 11H corresponding to the second silicide layer 42, and a part of the second connection structure 80 (such as the contact structure 81 mentioned above) may be disposed in the opening 11H, but not limited thereto. Additionally, in some embodiments, the first top surface 12A of the semiconductor layer 12 may be higher than the third top surface 42A of the second silicide layer 42 in the first direction D1, and a part of the second doped region 14D may be disposed between the first interlayer dielectric 50 and the second silicide layer 42 in the first direction D1, but not limited thereto.

Please refer to FIGS. 3-7 and FIG. 1. FIGS. 3-7 are schematic drawings illustrating a manufacturing method of the RF switch device according to the first embodiment of the present invention, and FIG. 1 may be regarded as a schematic drawing in a step subsequent to FIG. 7. As shown in FIG. 1, the manufacturing method of the RF switch device in this embodiment may include the following steps. Firstly, the semiconductor layer 12 formed on the insulation layer 11 is provided. The gate structure GS is formed on the semiconductor layer 12. The first doped region 14S and the second doped region 14D are formed in the semiconductor layer 12. The first doped region 14S and the second doped region 14D are formed at two opposite sides of the gate structure GS in the third direction D3 respectively. The epitaxial layer 20 is formed on the first doped region 14S. The first silicide layer 41 is formed on the epitaxial layer 30. The second silicide layer 42 is formed in the second doped region 14D.

Figure 3:
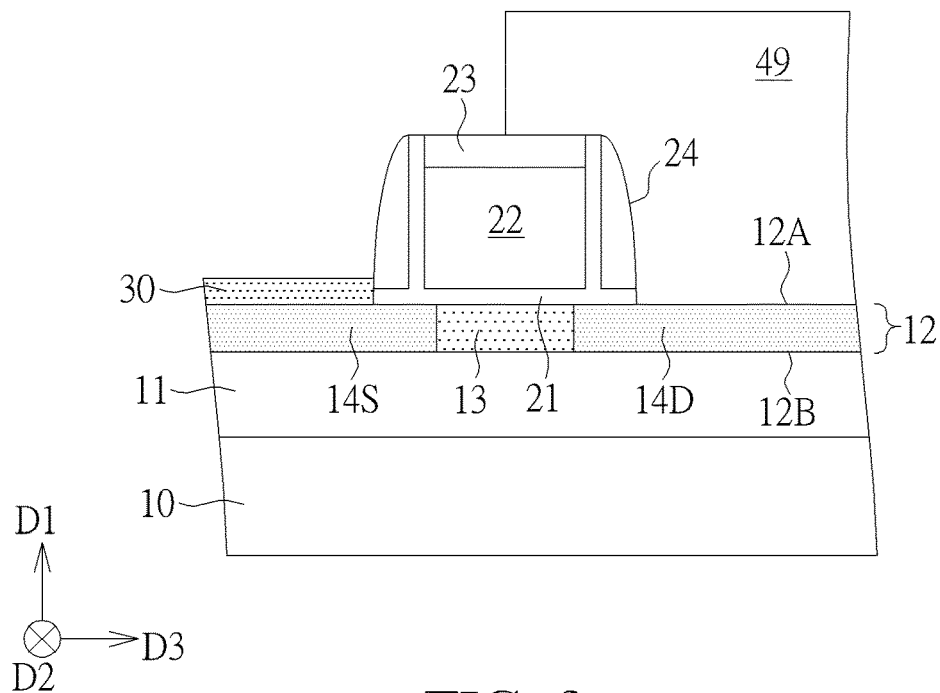
Figure 4:
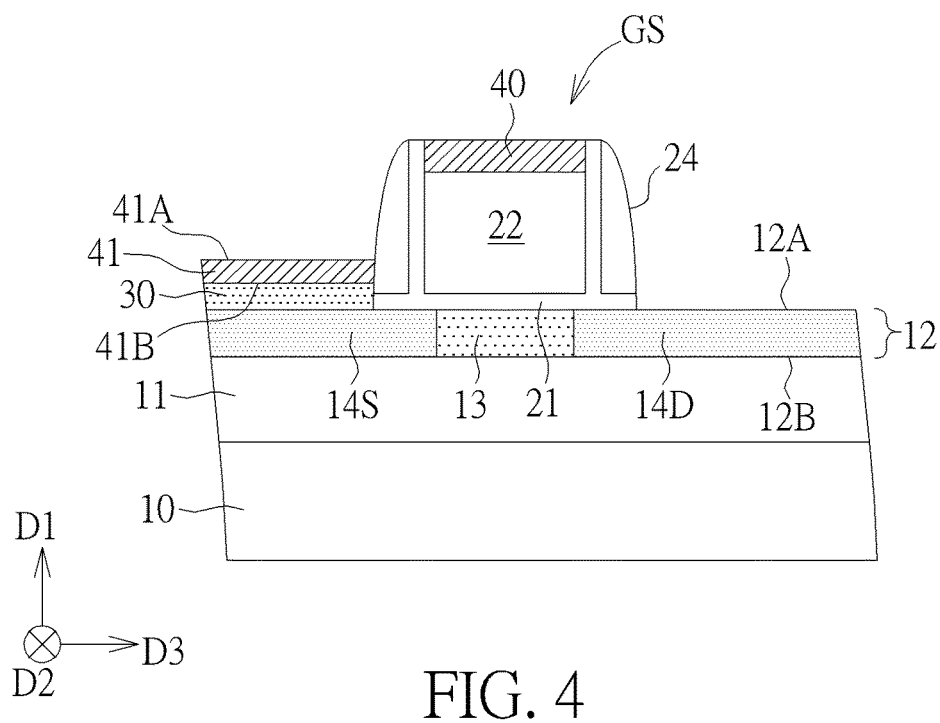

Specifically, the manufacturing method of the RF switch device 101 in this embodiment may include but is not limited to the following steps. As shown in FIG. 3, the insulation layer 11 may be formed on a substrate 10, and the semiconductor layer 12 may be formed on the insulation layer 11. In some embodiments, the substrate 10, the insulation layer 11, and the semiconductor layer 12 may be regarded as a SOI substrate, but not limited thereto. Therefore, the substrate 10 may include a silicon substrate or a substrate formed by other suitable materials. In addition, a capping layer 23 may be formed on the gate electrode 22, and the capping layer 23 may include silicon nitride, silicon oxynitride, nitrogen-doped silicon carbide (SiCN), or other suitable insulation materials. After the step of forming the first doped region 14S and the second doped region 14D, a patterned mask layer 49, such as a patterned photoresist layer, may be formed to cover the second doped region 14D, and an epitaxial growth process may be performed to form the epitaxial layer 30 on the first doped region 14S. Subsequently, as shown in FIG. 3 and FIG. 4, after the step of forming the epitaxial layer 30, the capping layer 23 may be removed, and the gate silicide layer 40 and the first silicide layer 41 may be formed while another patterned mask layer (not shown) is formed to cover the second doped region 14D. It is worth noting that before the step of forming the first silicide layer 41, a doping treatment may be performed to the epitaxial layer 30 for implanting an N type dopant into the epitaxial layer 30, but not limited thereto. Additionally, the gate silicide layer 40 and the first silicide layer 41 may be formed by forming a metal layer (not shown) covering the surface of the epitaxial layer 30 and the surface of the gat electrode 22 and performing a thermal treatment after the step of forming the metal layer, and the metal layer is removed after the step of forming the gate silicide layer 40 and the first silicide layer 41, but not limited thereto. The metal layer mentioned above may include cobalt (Co), nickel (Ni), or other appropriate metal materials. In some embodiments, the gate silicide layer 40 and the first silicide layer 41 may also be formed by other approaches.

Figure 5:
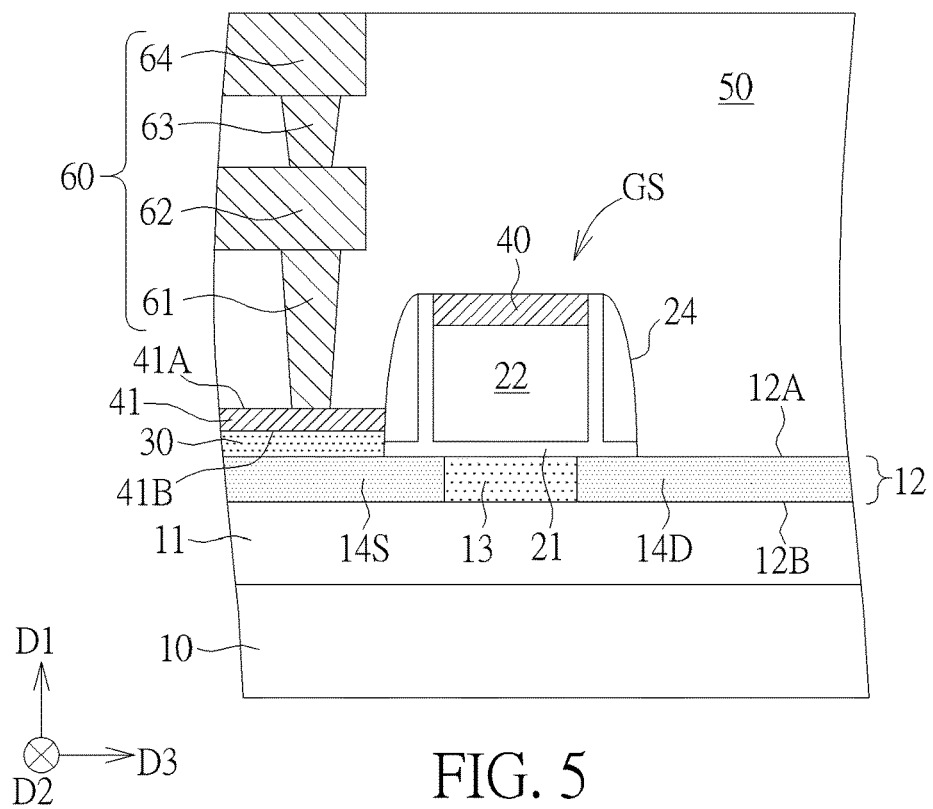
Figure 6:
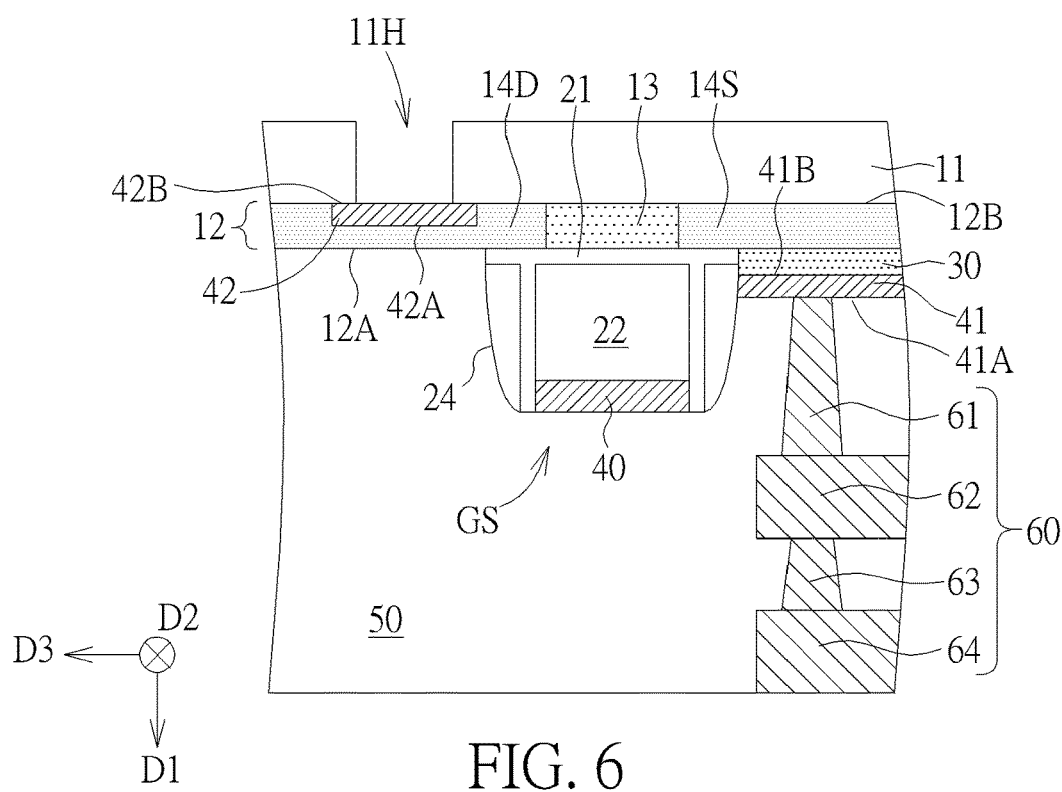
Figure 7:
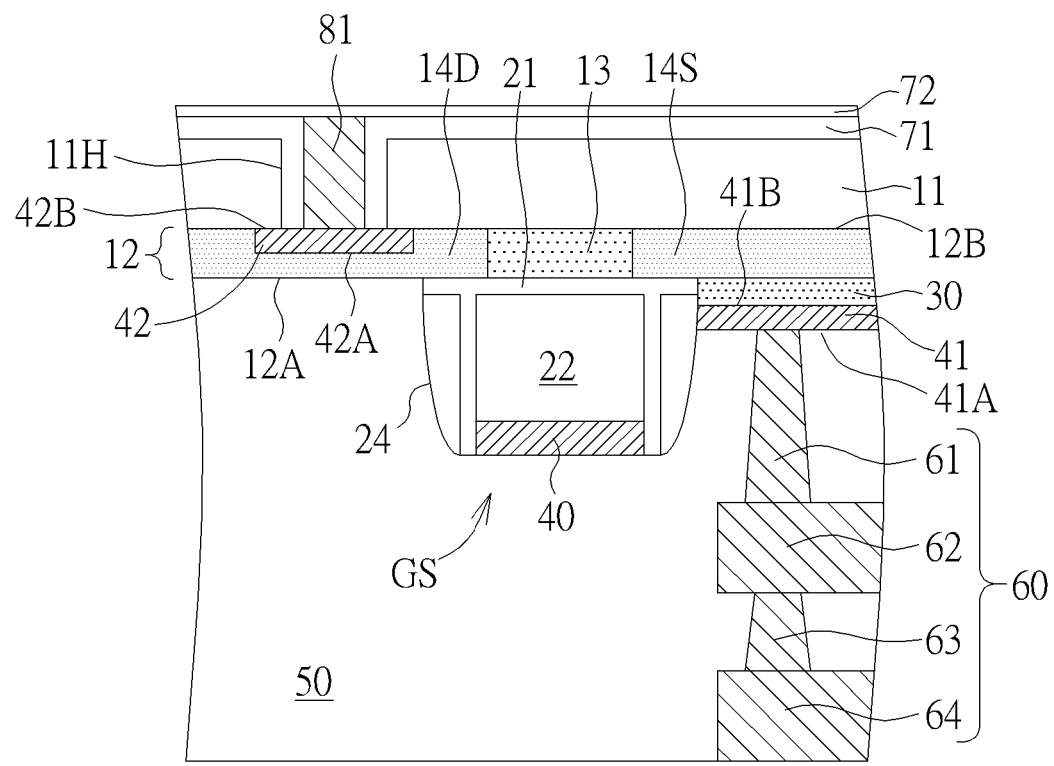
Figure 7:
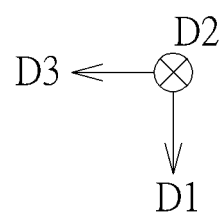

As shown in FIG. 5, the first interlayer dielectric 50 and the first connection structure 60 may be formed after the step of forming the gate silicide layer 40 and the first silicide layer 41. The first interlayer dielectric 50 may be formed on the gate structure GS, the semiconductor layer 12, and the first silicide layer 41. The first connection structure 60 may be formed in the first interlayer dielectric 50 and formed on the first silicide layer 41, and the first connection structure 60 is electrically connected with the first silicide layer 41. As shown in FIG. 5 and FIG. 6, after the steps of forming the first interlayer dielectric 50 and the first connection structure 60, the substrate 10 maybe removed and the insulation layer 11 may be reversed for forming the opening 11H in the insulation layer 11. The opening 11H may expose a part of the second doped region 14D for forming the second silicide layer 42 in the second doped region 14D. The forming method of the second silicide layer 42 maybe similar to that of the first silicide layer 41 mentioned above, but not limited thereto. In other words, the second silicide layer 42 may be formed after the step of forming the first silicide layer 41 in some embodiments, but not limited thereto. Subsequently, as shown in FIG. 7 and FIG. 1, the second interlayer dielectric 70 and the second connection structure 80 are formed. The second interlayer dielectric 70 is formed under semiconductor layer 12, the second connection structure 80 is formed in the second interlayer dielectric 70, and the second connection structure 80 is electrically connected with the second silicide layer 42. In other words, the second interlayer dielectric 70 and the second connection structure 80 may be formed after the step of forming the first connection structure 60, but not limited thereto.

In some embodiments, The first dielectric layer 71 may be formed on the insulation layer 11 and formed in the opening 11H first, and the contact structure 81 may then penetrate the first dielectric layer 71 in the opening 11H for contacting the second silicide layer 42 and being electrically connected with the second silicide layer 42, but not limited thereto. Subsequently, the hard mask layer 72 may be formed and covers the first dielectric layer 71 and the contact structure 81, and the interconnection structure 82 penetrating the second dielectric layer 73 and the hard mask layer 72 may be formed after the step of forming the second dielectric layer 73, but not limited thereto. The hard mask layer 72 mentioned above may be used to provide a protection effect for the contact structure 81 before the step of forming the interconnection structure 82, but not limited thereto. In some embodiments, another hard mask layer maybe disposed between the second dielectric layer 73 and the third dielectric layer 74 and/or be disposed between the third dielectric layer 74 and the fourth dielectric layer 75.

The first silicide layer 41 and the second silicide layer 42 may be formed on different planes by different process steps for increasing the distance between the first silicide layer 41 and the second silicide layer 42. The capacitance effects between the first silicide layer 41 and the second silicide layer 42 may be reduced accordingly, and the purpose of reducing the off capacitance of the RF switch device 101 maybe achieved. In addition, the first connection structure 60 may be regarded as a source connection structure and the second connection structure 80 may be regarded as a drain connection structure. The first connection structure 60 and the second connection structure 80 may be formed at the top side and the bottom side of the semiconductor layer 12 respectively for reducing the capacitance effects between the first connection structure 60 and the second connection structure 80 and further reducing the off capacitance of the RF switch device 101.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
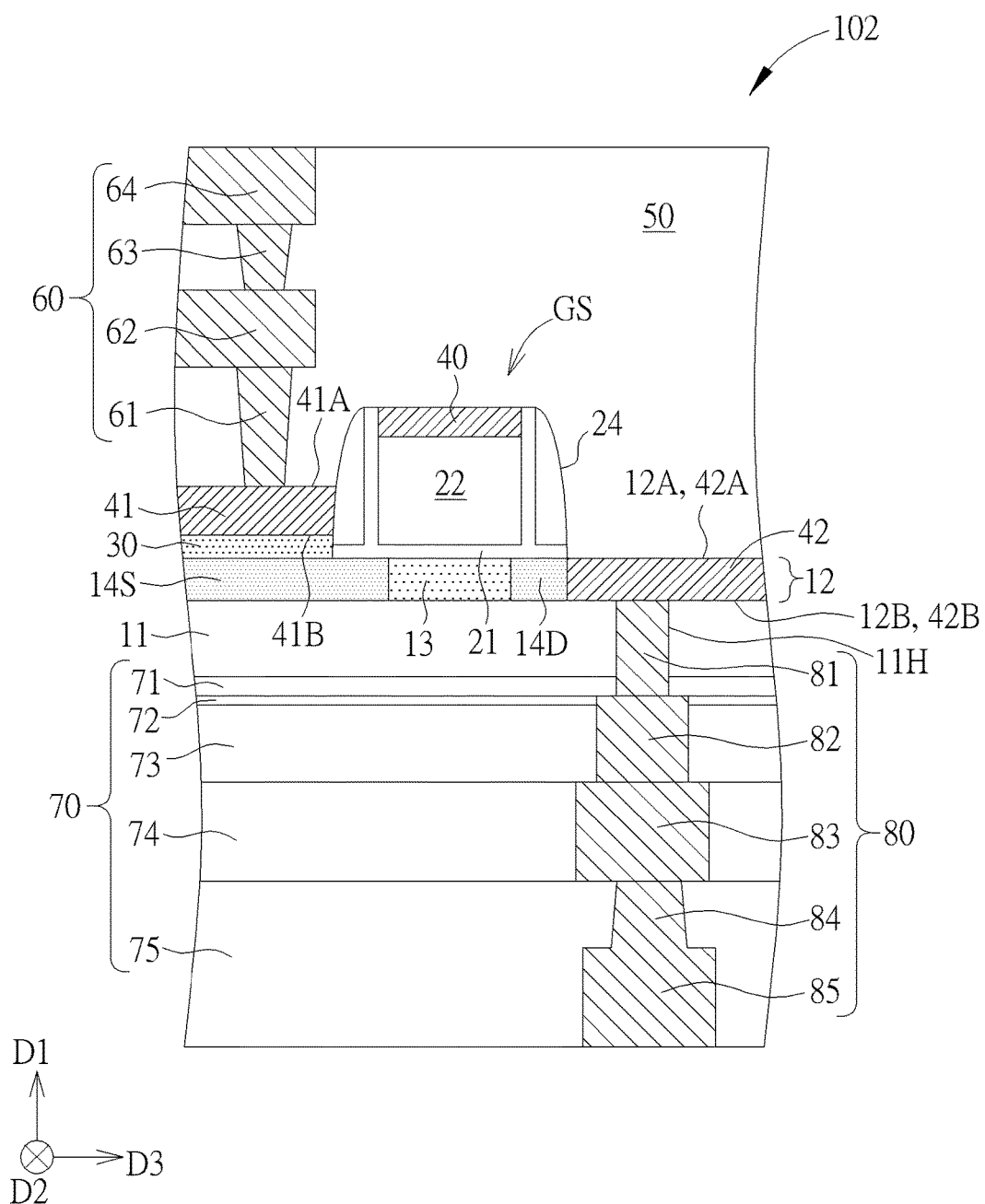
FIG. 8 is a schematic drawing illustrating a radiofrequency switch device according to a second embodiment of the present invention.
Figure 9:
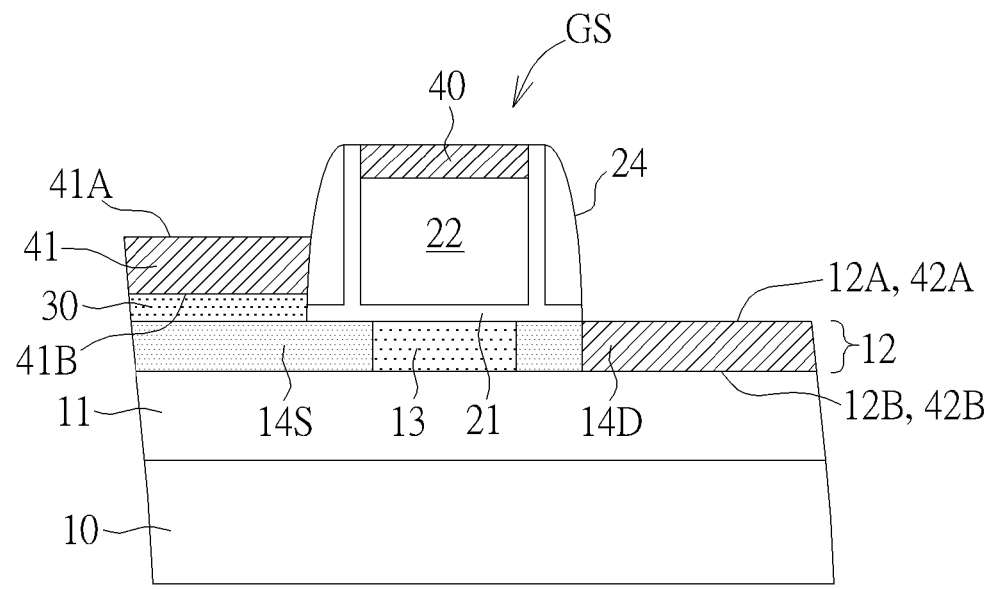
FIG. 9 is a schematic drawing illustrating a manufacturing method of the radiofrequency switch device according to the second embodiment of the present invention.
Figure 9:
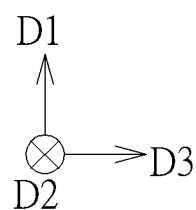

Please refer to FIG. 8 and FIG. 9. FIG. 8 is a schematic drawing illustrating a radiofrequency switch device 102 according to a second embodiment of the present invention. FIG. 9 is a schematic drawing illustrating a manufacturing method of the RF switch device 102 in this embodiment. As shown in FIG. 8, the difference between this embodiment and the first embodiment mentioned above is that, in this embodiment, a bottom surface (such as a third bottom surface 42B shown in FIG. 8) of the second silicide layer 42 and a bottom surface (such as a first bottom surface 12B shown in FIG. 8) of the semiconductor layer 12 may be coplanar in the first direction D1, but not limited thereto. As shown in FIG. 9, in some embodiments, the second silicide layer 42, the first silicide layer 41, and the gate silicide layer 40 maybe formed together by the same step. The second silicide layer 42, the first silicide layer 41, and the gate silicide layer 40 may be formed after the step of forming the epitaxial layer 30. Additionally, the second silicide layer 42 may extend to the bottom of the semiconductor layer by reducing the thickness of the semiconductor layer 12, and the third bottom surface 42B of the second silicide layer 42 and the first bottom surface 12B of the semiconductor layer 12 may be coplanar accordingly. In some embodiments, the thickness of the semiconductor layer 12 may be controlled within a range from 20 nanometers to 30 nanometers for realizing the condition mentioned above, but not limited thereto. Comparatively, the thickness of the semiconductor layer 12 in the first embodiment may be controlled within a range from 50 nanometers to 100 nanometers, but not limited thereto. Under the condition described above, the RF switch device 102 may be regarded as a fully depleted transistor, and the RF switch device in the first embodiment may be regarded as a partially depleted transistor, but not limited thereto.

To summarize the above descriptions, in the RF switch device and the manufacturing thereof according to the present invention, the distance between the first silicide layer and the second silicide layer may be increased by forming the first silicide layer on the epitaxial layer and forming the second silicide layer in the doped region. The capacitance effects between the first silicide layer and the second silicide layer may be reduced accordingly, and the purpose of reducing the off capacitance of the RF switch device maybe achieved. Additionally, the first connection structure electrically connected with the first silicide layer and the second connection structure electrically connected with the second silicide layer may be formed at the top side and the bottom side of the semiconductor layer respectively for reducing the capacitance effects between the first connection structure and the second connection structure and further reducing the off capacitance of the RF switch device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radiofrequency (RF) switch device, comprising:
an insulation layer;
a semiconductor layer disposed on the insulation layer;
a gate structure disposed on the semiconductor layer;
a first doped region and a second doped region, wherein the first doped region and the second doped region are disposed in the semiconductor layer and disposed at two opposite sides of the gate structure respectively;
an epitaxial layer disposed on the first doped region;
a first silicide layer disposed on the epitaxial layer;
a second silicide layer disposed in the second doped region;
a first interlayer dielectric disposed on the gate structure, the semiconductor layer, and the first silicide layer;
a first connection structure disposed in the first interlayer dielectric and disposed on the first silicide layer, wherein the first connection structure is electrically connected with the first silicide layer;
a second interlayer dielectric disposed under the semiconductor layer; and
a second connection structure disposed in the second interlayer dielectric, wherein the second connection structure is electrically connected with the second silicide layer.

2. The RF switch device according to claim 1, wherein the first doped region is a source doped region, and the second doped region is a drain doped region.

3. The RF switch device according to claim 1, wherein a top surface of the first silicide layer is higher than a top surface of the second silicide layer in a thickness direction of the insulation layer.

4. The RF switch device according to claim 3, wherein a bottom surface of the first silicide layer is higher than a top surface of the semiconductor layer in the thickness direction of the insulation layer.

5. The RF switch device according to claim 1, wherein a bottom surface of the first silicide layer is higher than a top surface of the second silicide layer in a thickness direction of the insulation layer.

6. The RF switch device according to claim 1, wherein a top surface of the semiconductor layer is higher than a top surface of the second silicide layer in a thickness direction of the insulation layer.

7. The RF switch device according to claim 1, wherein a part of the second doped region is disposed between the first interlayer dielectric and the second silicide layer.

8. The RF switch device according to claim 1, wherein the insulation layer comprises an opening corresponding to the second silicide layer, and a part of the second connection structure is disposed in the opening.

9. A manufacturing method of a radiofrequency (RF) switch device, comprising:
providing a semiconductor layer formed on an insulation layer;
forming a gate structure on the semiconductor layer;
forming a first doped region and a second doped region in the semiconductor layer, wherein the first doped region and the second doped region are formed at two opposite sides of the gate structure respectively;
forming an epitaxial layer on the first doped region;
forming a first silicide layer on the epitaxial layer;
forming a second silicide layer in the second doped region;
forming a first interlayer dielectric on the gate structure, the semiconductor layer, and the first silicide layer;
forming a first connection structure in the first interlayer dielectric and on the first silicide layer, wherein the first connection structure is electrically connected with the first silicide layer;
forming a second interlayer dielectric under the semiconductor layer; and
forming a second connection structure in the second interlayer dielectric, wherein the second connection structure is electrically connected with the second silicide layer.

10. The manufacturing method of the RF switch device according to claim 9, wherein the first doped region is a source doped region, and the second doped region is a drain doped region.

11. The manufacturing method of the RF switch device according to claim 9, wherein a top surface of the first silicide layer is higher than a top surface of the second silicide layer in a thickness direction of the insulation layer.

12. The manufacturing method of the RF switch device according to claim 11, wherein a bottom surface of the first silicide layer is higher than a top surface of the semiconductor layer in the thickness direction of the insulation layer.

13. The manufacturing method of the RF switch device according to claim 9, wherein a bottom surface of the first silicide layer is higher than a top surface of the second silicide layer in a thickness direction of the insulation layer.

14. The manufacturing method of the RF switch device according to claim 9, wherein a top surface of the semiconductor layer is higher than a top surface of the second silicide layer in a thickness direction of the insulation layer.

15. The manufacturing method of the RF switch device according to claim 9, wherein the second silicide layer is formed after the step of forming the first silicide layer.

16. The manufacturing method of the RF switch device according to claim 9, wherein the second silicide layer and the first silicide layer are formed by the same step, and the second silicide layer and the first silicide layer are formed after the step of forming the epitaxial layer.

17. The manufacturing method of the RF switch device according to claim 9, wherein the second interlayer dielectric is formed after the step of forming the first connection structure.

* * * * *